United States Patent [19]
Nishizaki et al.

[11] Patent Number: 6,090,478
[45] Date of Patent: Jul. 18, 2000

[54] SOUND ABSORBING/SHIELDING AND ELECTRIC WAVE ABSORBING PLASTIC SHEET CONTAINING ENCAPSULATED MAGNETIC FLUID, AND SOUND ABSORBING/SHIELDING AND ELECTRIC WAVE ABSORBING PLASTIC PANEL

[75] Inventors: Akihiko Nishizaki, Koriyama; Koji Tanaka, Kashiwara; Toshihiko Shibamoto, Yao, all of Japan

[73] Assignees: Nitto Boseki Co., Ltd., Fukushima; Matsumoto Yushi-Seiyaku Co., Ltd., Yao, both of Japan

[21] Appl. No.: 09/147,016

[22] PCT Filed: Mar. 4, 1997

[86] PCT No.: PCT/JP97/00645

§ 371 Date: Sep. 11, 1998

§ 102(e) Date: Sep. 11, 1998

[87] PCT Pub. No.: WO97/34057

PCT Pub. Date: Sep. 18, 1997

[51] Int. Cl.[7] .................................................. B32B 5/26
[52] U.S. Cl. .................................... 428/297.4; 428/321.1; 428/321.5; 428/900
[58] Field of Search .............................. 428/321.1, 321.5, 428/297.4, 900

[56] References Cited

U.S. PATENT DOCUMENTS 3,460,248  8/1969  Tate .
4,232,084  11/1980  Tate ...................................... 428/321.5
5,343,184  8/1994  Matsui et al. .

FOREIGN PATENT DOCUMENTS 64-86596   3/1989  Japan .
4-369598  12/1992  Japan .

Primary Examiner—Elizabeth M. Cole
Attorney, Agent, or Firm—Armstrong, Westerman, Hattori, McLeland & Naughton

[57] ABSTRACT

A light-weight sound absorbing and insulating plastic sheet material which exhibits an excellent sound absorbing and insulating effect even in the low- and medium-pitched sound range for use in building materials and sound-proof walls and a sound absorbing and insulating plastic panel using the plastic sheet material are provided. The sound absorbing and insulating plastic sheet material of the present invention comprises a plastic sheet-formed substance and magnetic fluid-enclosing capsules contained in the sheet-formed substance. The sound absorbing and insulating plastic panel of the present invention comprises the above-mentioned sound absorbing and insulating plastic sheet material and a fiber-reinforced plastic sheet bound to at least one side of the sheet material. The sound absorbing and insulating plastic sheet material and the sound absorbing and insulating plastic panel of the present invention are excellent also in electromagnetic wave shielding effect.

8 Claims, 2 Drawing Sheets

SOUND ABSORBING/SHIELDING AND ELECTRIC WAVE ABSORBING PLASTIC SHEET CONTAINING ENCAPSULATED MAGNETIC FLUID, AND SOUND ABSORBING/SHIELDING AND ELECTRIC WAVE ABSORBING PLASTIC PANEL

This application is a 371 of PCT/JP97/00645 filed Mar. 4, 1997.

TECHNICAL FIELD

The present invention relates to a plastic sheet material for sound absorption and insulation and electric wave absorption containing magnetic fluid-enclosing capsules, a sound absorbing and insulating plastic panel useful particularly for sound absorption and insulation in building materials and a plastic panel for electric wave absorption useful for shielding electromagnetic waves in mobile communication or the like.

BACKGROUND ART

Up to now, plastics panels having a sound-proofing property are in wide use, because of their light weight, as external wall materials, interior lining materials and roofing materials for buildings, as sound-proof walls for high ways and railways, and for other like uses. Such plastic panels are commonly used by incorporating into the inside thereof, to be imparted sound-proofing property, porous materials, such as formed plastics and glass wool, or finely partitioned hollow cells.

However, such plastic panels having porous, hollow cell structures are all poor in sound absorbing and insulating effect in the low- and medium-pitched sound range (100–200 Hz), and cannot give a satisfactory sound absorbing and insulating effect for a wide range of pitches of sound.

Further, since they have predominantly continuous pores, they are poor in resistance to a local load and unsatisfactory in mechanical strength.

An example of panels for sound-proofing in the low- and medium-pitched sound range is a sound-proof panel obtained by filling sand particles into the inner space of a sandwich type panel disclosed in JP-A-53-72313.

In this method, however, it is difficult to fill sand particles into the inner space of the panel closely without leaving gaps in order to attain a sufficient sound-proofing characteristic. Moreover, since sand is weighty, it is difficult to obtain panels of light weight.

JP-A-5-279569 discloses a vibration-proofing material comprising a silicone gel having a specific pressure transmission characteristic and hollow microspheres formed of an inorganic material, such as aluminosilicate, incorporated thereinto. However, the material aims at vibration proofing and damping in the range of 100 Hz or less, and nothing is taught of the sound absorption and insulation property of the material in the disclosure.

The object of the present invention is, overcoming the above-mentioned difficulties, to provide a light-weight plastic sheet material having an excellent sound absorbing and insulating effect even in the low- and medium-pitched sound range and a sound absorbing and insulating plastic panel using the sheet material for use in buildings and sound-proof walls.

DISCLOSURE OF THE INVENTION

Thus, the present invention relates to a sound absorbing and insulating plastic sheet material comprising a plastic sheet-formed substance and magnetic fluid-enclosing capsules contained in the sheet-formed substance.

By incorporating the magnetic fluid-enclosing capsules into the inside of the plastic sheet-formed substance, the sound energy transmitted from the outside to the shell of the capsule is converted into vibration energy by the magnetic substance fine particles in the magnetic fluid included in the capsule, and thus an excellent sound absorbing and insulating effect is obtained. Moreover, since the magnetic substance fine particles have a large mass as compared with the capsule shell, the above-mentioned effect is still more enhanced, and a sound absorbing and insulating plastic sheet material, which has an excellent sound absorbing and insulating effect even in the low- and medium-pitched sound range, can be provided.

Furthermore, it is advantageous that the sound absorbing and insulating plastic panel according to the present invention which comprises the above-mentioned sound absorbing and insulating plastic sheet material and a fiber-reinforced plastic sheet bound to at least one side of the sheet material is excellent in mechanical strength and rigidity, and the sound absorbing and insulating plastic panel according to the present invention which comprises the above-mentioned sound absorbing and insulating plastic material and a fiber-reinforced plastic sheet integrally molded onto at least one side of the plastic material hardly peels apart and is durable.

The sound absorbing and insulating plastic sheet material of the present invention comprises a plastic sheet-formed substance and magnetic fluid-enclosing capsules contained therein. The magnetic fluid in the magnetic fluid-enclosing capsule is preferably a dispersion of magnetic substance fine particles in an organic solvent, and the shell of the capsule is preferably formed essentially of a membrane of a plastic exemplified by a vinyl resin.

The magnetic fluid-enclosing capsules are preferably those which enclose a magnetic fluid obtained by dispersing fine particles of ferrite in an organic solvent and of which the shell is a vinyl resin.

The sound absorbing and insulating plastic panel of the present invention may comprise a sound absorbing and insulating plastic sheet material and a fiber-reinforced plastic sheet bound to at least one side of the sheet material.

Furthermore, the sound absorbing and insulating plastic panel may comprise the sound absorbing and insulating sheet material and a fiber-reinforced plastic sheet integrally molded onto at least one side of the sheet material.

The sound absorbing and insulating plastic sheet material and the sound absorbing and insulating plastic panel of the present invention are explained with reference to the accompanying drawings. FIG. 1 is a schematic sectional view of one example of the sound absorbing and insulating plastic sheet material of the present invention.

The plastic sheet material for electric wave absorption and the plastic panel for electric wave absorption of the present invention may be obtained in exactly the same manner as the sound absorbing and insulating plastic sheet material and the sound absorbing and insulating plastic panel.

In FIG. 1, the sound absorbing and insulating plastic sheet material 1 comprises a plastic sheet-formed substance 3 and magnetic fluid-enclosing capsules 2 contained therein.

The plastic sheet-formed substance 3 refers to a sheet-formed substance made of a plastic. The kind of the plastic is not particularly limited, so long as it can incorporate thereinto magnetic fluid-enclosing capsules 2 and can be molded at relatively low temperatures, preferably at about 20–100° C., more preferably 40–60° C., and may be either thermosetting type or thermoplastic type. It is preferably a plastic comprising a thermosetting resin, such as unsaturated polyester resin, phenol resin, epoxy resin, vinyl ester resin, melamine resin and urea resin, or a thermoplastic resin, such as saturated polyester resin, polyethylene resin, polypropylene resin, polyamide resin, poly(vinyl chloride) resin, poly (vinylidene chloride) resin, polystyrene resin and acrylic resin, particularly preferably unsaturated polyester resin.

It is needless to say that the sheet-formed substance 3 may be that of a fiber-reinforced plastic obtained by combining the above-mentioned plastic with reinforcing fiber, such as glass fiber, carbon fiber and aramid fiber.

The thickness of the plastic sheet-formed substance 3 is not particularly limited and may be appropriately determined according to the uses and kinds of the intended building material. It is preferably 0.05–100 mm.

The magnetic fluid-enclosing capsule 2 to be incorporated into the plastic sheet-formed substance 3 may comprise a shell formed essentially of a homopolymer such as vinylidene chloride resin, vinyl chloride resin and acrylonitrile resin or a copolymer thereof and, enclosed in the shell, a fluid comprising a hydrocarbon type organic solvent, such as n-hexane and paraffin oil, and fine particles of a magnetic substance, such as ferrite and magnetite, 5–200 nm in size dispersed in the solvent.

The inside of the magnetic fluid-enclosing capsule 2 comprises the liquid dispersion of magnetic substance fine particles and a hollow space. The volume occupied by the liquid dispersion of magnetic substance fine particles is preferably 1–30% by volume, more preferably 10–15% by volume, based on the volume of the inside. The average particle diameter of the capsule used is preferably 5–100 $\mu$m, more preferably 100–200 $\mu$m. When the volume occupied by the liquid dispersion of magnetic substance fine particles is less than 1%, the sound absorbing and insualting effect tends to be insufficient, whereas when it exceeds 30%, the preparation of the magnetic fluid-enclosing capsules tends to be difficult.

The content of the magnetic fluid-enclosing capsule 2 relative to the plastic sheet-formed substance 3 is not particularly limited, but it is preferably 30–90% weight, more preferably 40–50% by weight. When the content is less than 30%, the sound absorbing and insulating effect tends to be poor, whereas when it exceeds 90%, a sheet-formed product tends to be difficult to prepare.

The magnetic fluid-enclosing capsules 2 may be incorporated into the plastic sheet-formed substance 3 as follows. When the plastic is a thermosetting resin, the incorporation may be conducted, for example, by adding a predetermined amount of the magnetic fluid-enclosing capsules 2 to a liquid thermosetting resin (uncured) and forming the resulting mixture into the form of sheet by semicuring or curing. When the plastic is a thermoplastic resin, it may be conducted, for example, by kneading, while heating and melting, pellets of the thermoplstic resin and the magnetic fluid-enclosing capsules 2 and forming the kneaded product into the form of sheet.

When a thermosetting resin is used, a sound absorbing and insulating plastic panel comprising a sound absorbing and insulating plastic sheet material and a fiber-reinforced plastic sheet bound to at least one side of the sheet material can be easily prepared by integral molding, and moreover the sheet material having a relatively good heat resistance can be obtained. When a thermoplastic resin is used, on the other hand, the sheet material can be easily formed and moreover, a relatively soft sheet material, which is easy to handle, can be obtained.

In the preparation of the plastic sheet material, there may be added, if necessary and desired, microballoons such as hollow glass balloons, shirasu balloons and plastic balloons (enclosing no magnetic fluid) or conventional modifiers, such as calcium carbonate, iron powder, silica sand and pigments. For example, by using glass balloons, the weight of the plastic sheet material can be reduced, and sound absorption and insulation characteristics and further heat resistance can be enhanced.

FIG. 2 is a schematic sectional view showing one example of the sound absorbing and insulating plastic panel of the present invention.

The fiber-reinforced plastic (sheet) 4 may be bound to at least one side (one side alone in FIG. 2) of the sound absorbing and insulating plastic sheet material 1 by, for example, 1) integral molding, 2) application of an adhesive (for example, epoxy type adhesive), followed by adhering and sticking and 3) fixing by means of nails, bolts, and the like.

The integral molding of the fiber-reinforced plastic 4 onto at least one side of the sound absorbing and insulating plastic sheet material 1 may be conducted by conventional methods used for molding fiber-reinforced plastics (FRP). For example, 1) a sound absorbing and insulating plastic sheet material 1, wherein a matrix resin is a thermoplastic resin, is placed in a mold, then pre-heated, and a fiber-reinforced plastic material, e.g., a sheet molding compound, is laminated on the sheet material 1 and cured by heating, or 2) a sound absorbing and insulating plastic sheet material 1, wherein a matrix resin is a thermosetting resin, and reinforcing fiber are placed in a mold, and a thermosetting resin, e.g., unsaturated polyester resin, is poured into the mold from the injection port provided in the mold, and then cured to obtain an integral body.

The integral molding of the fiber-reinforced plastic 4 onto both sides of the sound absorbing and insulating plastic sheet material 1 may also be conducted, in a similar manner to that described above, by further laminating the fiber-reinforced plastic 4 on the uppermost part, followed by molding.

In the sound absorbing and insulating plastic panel having a fiber-reinforced plastic integrally molded onto one or both sides, the thickness of one side of the fiber-reinforced plastic part is not particularly limited and is preferably 1.0–10.0 mm.

The reinforcing fiber 5 used in the fiber-reinforced plastic 4 bound to the sound absorbing and insulating plastic sheet material 1 may be conventional reinforcing fibers, e.g., glass fiber, carbon fiber, aramid fiber and born fiber. Particularly preferred is glass fiber in consideration of its quality, price and other factors.

In using glass fibers, those with a fiber diameter of 3–20 $\mu$m are preferable.

The resin 6 constituting the matrix of the fiber-reinforced plastic 4 may be either thermosetting or thermoplastic. It may be a thermosetting resin, such as unsaturated polyester resin, phenol resin, epoxy resin, vinyl ester resin, melamine resin and urea resin, or a thermoplastic resin, such as saturated polyester resin, polyethylene resin, polypropylene resin, polyamide resin, poly(vinyl chloride) resin, polystyrene resin and acrylic resin.

The content of the reinforcing fiber 5 in the fiber-reinforced plastic 4 is not particularly restricted but is preferably 15–80% by weight. When the content is less than 15% by weight, the strength tends to be insufficient, whereas when it exceeds 80% by weight, the fiber-reinforced plastic tends to be difficult to mold.

BEST MODE FOR CARRYING OUT THE INVENTION

The present invention is further described in detail with reference to Examples and Comparative Examples, but the invention is not limited thereto.

The sound absorbing and insulating plastic sheet material and the sound absorbing and insulating plastic panel of the present invention were prepared in practice and evaluated for then properties.

In the following Examples, the magnetic fluid-enclosing capsules 2 used comprised a dispersion of fine particles (average diameter: 100 nm) of ferrite in paraffin oil used as the organic solvent and a shell of vinylidene chloride-acrylonitrile resin enclosing the dispersion therein, and had an average particle diameter of 30 µm. Plastic sheet materials were prepared by using the capsules 2 described above in the respective manners described below.

The sound absorbing and insulating plastic sheet materials and the sound absorbing and insulating plastic panels obtained were evaluated for their sound absorption and insulation characteristics by determining sound transmission loss at center frequencies of 125 Hz, 500 Hz, 1,000 Hz and 2,000 Hz according to JIS-A-1416. The results obtained are shown in Table 1.

EXAMPLE 1

Unsaturated polyester resin was kneaded with 30% by weight of the magnetic fluid-enclosing capsules 2 and then kneaded with 15% by weight of glass balloons to obtain a sound absorbing and insulating plastic sheet material 1 of the present invention having a thickness of 3 mm.

EXAMPLE 2

Figure 1:
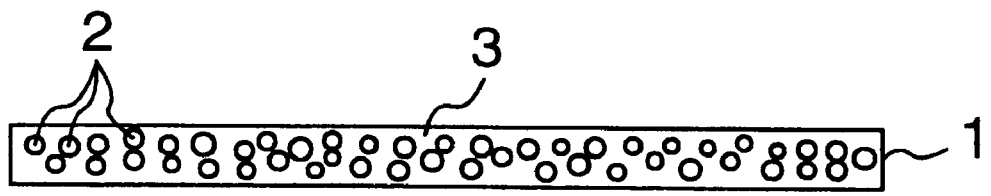
FIG. 1 is a schematic sectional view showing one example of the sound absorbing and insulating plastic sheet material of the present invention.
Figure 2:
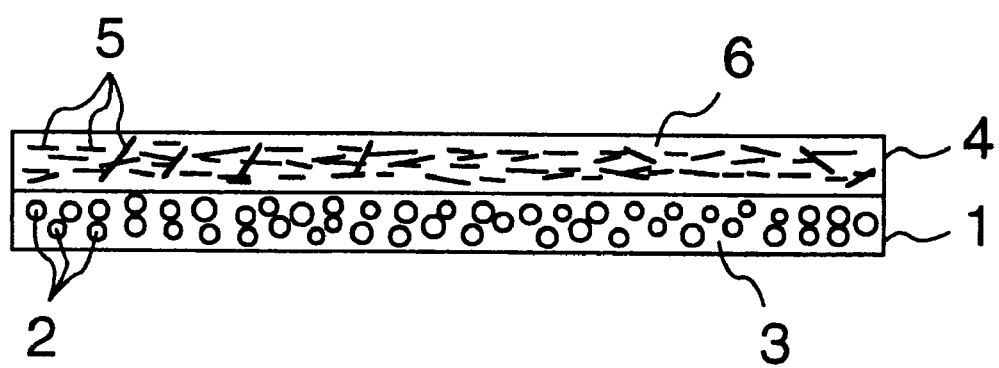
FIG. 2 is a schematic sectional view showing one example of the sound absorbing and insulating plastic panel of the present invention. There drawings are merely for illustrating representative examples of the embodiment of the present invention and in no way limit the present invention.

In a mold, as shown in FIG. 2, was placed as the fiber-reinforced plastic 4 a molding base material (sheet molding compound, 2.0 mm in thickness) comprising glass fiber and unsaturated polyester resin, and then the sound absorbing and insulating plastic sheet material 1 obtained in Example 1 was placed thereon. Molding was conducted by heating at 150° C. for 3 minutes to obtain a sound absorbing and insulating plastic panel of the present invention.

EXAMPLE 3

A polyamide (PA-6) resin was kneaded with 50% by weight of the magnetic fluid-enclosing capsules 2 and then kneaded with 15% by weight of glass balloons to obtain a sound absorbing and insulating plastic sheet material 1 of the present invention having a thickness of 3 mm.

EXAMPLE 4

In a mold was placed as the fiber-reinforced plastic sheet 4 a molding base material (sheet molding compound, 3.0 mm in thickness) comprising glass fiber and unsaturated polyester resin, and the sound absorbing and insulating plastic sheet material 1 obtained in Example 3 was placed thereon. Integral molding was conducted by heating at 150° C. for 3 minutes to obtain a sound absorbing and insulating plastic panel having a fiber-reinforced plastic sheet on one side thereof according to the present invention.

Comparative Example 1

A plastic sheet material was prepared in the same manner as in Example 1 except that no magnetic fluid-enclosing capsule were incorporated thereinto.

Comparative Example 2

A plastic panel was prepared in the same manner as in Example 2 except that the plastic sheet material of Comparative Example 1 was used in place of that of Example 1.

Comparative Example 3

A plastic sheet material was prepared in the same manner as in Example 3 except that no magnetic fluid-enclosing capsule were incorporated thereinto.

Comparative Example 4

A plastic panel was prepared in the same manner as in Example 4 except that the plastic sheet material of Comparative Example 3 was used in place of that of Example 3.

TABLE 1

| Frequency | Example | | | | Comparative Example | | | |
|---|---|---|---|---|---|---|---|---|
| [Hz] | 1 | 2 | 3 | 4 | 1 | 2 | 3 | 4 |
| 125 | 18 | 18 | 19 | 20 | 8 | 8 | 7 | 9 |
| 500 | 23 | 24 | 24 | 24 | 13 | 15 | 12 | 14 |
| 1000 | 29 | 24 | 26 | 27 | 17 | 20 | 17 | 20 |
| 2000 | 33 | 34 | 33 | 32 | 20 | 23 | 09 | 21 |//
| | | | | Unit: [dB] | | | | |

INDUSTRIAL APPLICABILITY

The sound absorbing and insulating plastic sheet material containing magnetic fluid-enclosing capsules according to the present invention is excellent not only in sound-proofing characteristics but also in sound absorption and insulation characteristics, particularly in low-pitched sound range, and hence it is useful as a sound absorbing and insulating plastic sheet material for building materials and sound-proof walls.

Further, since the sheet material contains magnetic fluid-enclosing capsules, the material also exhibits an electromagnetic wave shielding effect and hence is useful as materials for electromagnetic wave absorbers and wave-absorbing panels. In particular, for example, a plastic panel obtained by integrally molding a carbon fiber-reinforced unsaturated polyester resin onto at least one side of the sheet material exhibits the above-mentioned effect remarkably in the communication frequency range (800 MHz or more) and can be favorably used for housings and the like of communication equipment, etc.

Figure 3:
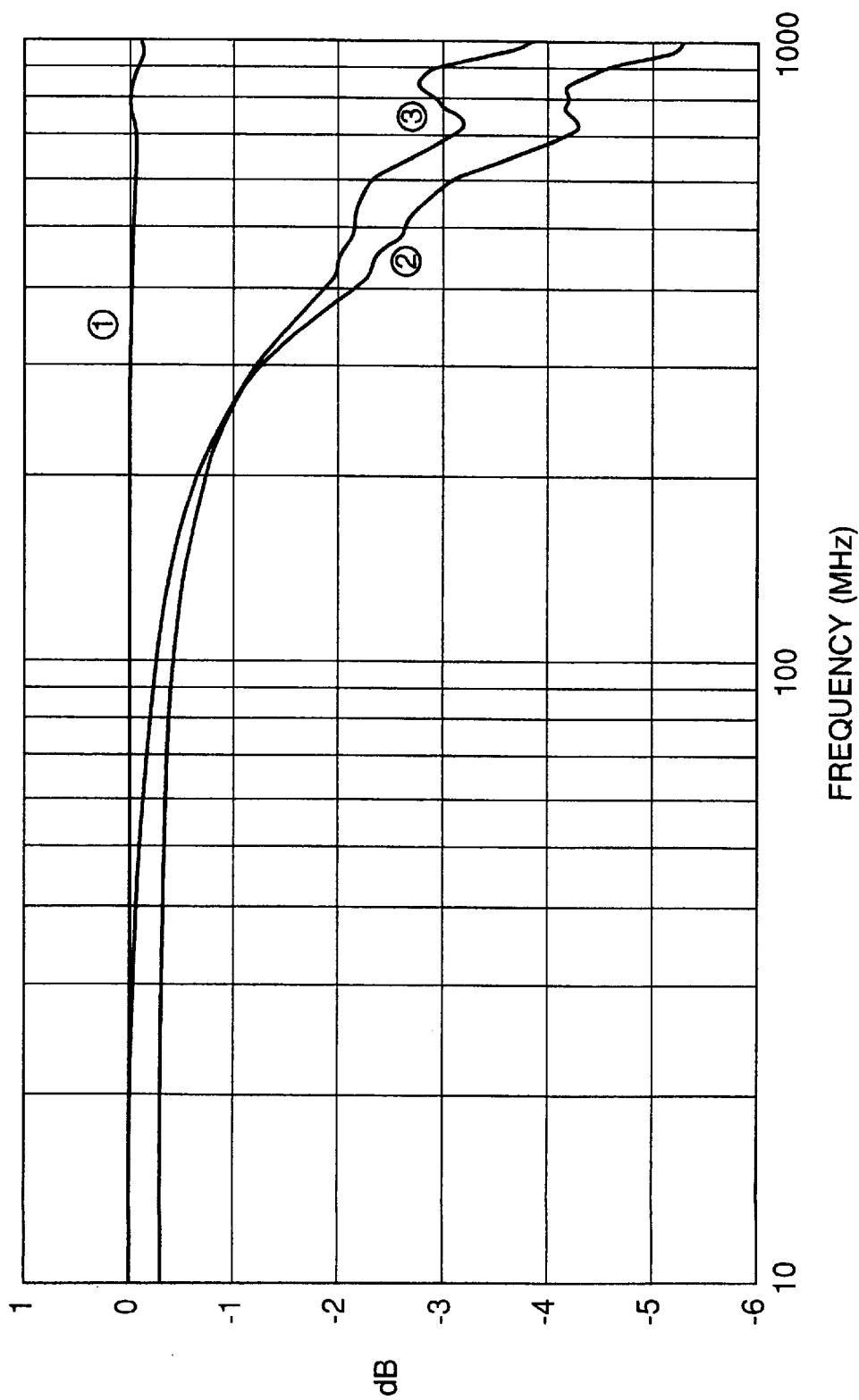
FIG. 3 shows results of determination of electromagnetic wave transmission loss of the panel.

Sandwitch panels were prepared which comprised as the core material a bell-formed structure of magnetic fluid-enclosing microcapsules and as the surface material of the both sides, ① GF (glass fiber-reinforced plastic) mat, ② CF (carbon fiber-reinforced plastic) mat and ③ CF cloth, respectively. The panels were evaluated for their electromagnetic wave transmission loss and the results are shown in FIG. 3.

Panels obtained by binding a fiber-reinforced plastic to at least one side of the sound absorbing and insulating plastic sheet material of the present invention by integral molding or by adhesion have good mechanical strength and durability, and are particularly useful for building materials and sound-proof walls.

We claim:

1. A plastic sheet material which comprises a plastic sheet-formed substance and magnetic fluid-enclosing capsules contained in the sheet-formed substance, said plastic sheet material has a sound absorbing and insulating property and the magnetic fluid-enclosing capsule comprises a shell and a magnetic fluid enclosed therein, the magnetic fluid being a dispersion of magnetic substance particles in a fluid, the magnetic substance particles being 5–200 nm in size.

2. The plastic sheet material according to claim 1 wherein the magnetic fluid-enclosing capsule comprises a shell and a magnetic fluid enclosed therein, the magnetic fluid being a dispersion of ferrite fine particles in an organic solvent and the shell being formed essentially of a vinyl resin.

3. A plastic panel which comprises the sound absorbing and insulating plastic sheet material according to claim 1 or 2 and a fiber-reinforced plastic sheet bound to at least one side of the sheet material.

4. A plastic panel which comprises the sound absorbing and insulating plastic sheet material according to claim 1 or 2 and a fiber-reinforced plastic sheet integrally molded onto at least one side of the sheet material.

5. A plastic sheet material for electric wave absorption which comprises a plastic sheet-formed substance and magnetic fluid-enclosing capsules contained in the sheet-formed substance, said plastic sheet material has an electric wave absorbing property and the magnetic fluid-enclosing capsule comprises a shell and a magnetic fluid enclosed therein, the magnetic fluid being a dispersion of magnetic substance particles in a fluid, the magnetic substance particles being 5–200 nm in size.

6. The plastic sheet material for electric wave absorption according to claim 5 wherein the magnetic fluid-enclosing capsule comprises a shell and a magnetic fluid enclosed therein, the magnetic fluid being a dispersion of ferrite fine particles in an organic solvent and the shell being formed essentially of a vinyl resin.

7. A plastic panel for electric wave absorption which comprises the plastic sheet material for electric wave absorption according to claim 5 or 6 and a fiber-reinforced plastic sheet bound to at least one side of the sheet material.

8. A plastic panel for electric wave absorption which comprises the plastic sheet material for electric wave absorption according to claim 5 or 6 and a fiber-reinforced plastic sheet integrally molded onto at least one side of the sheet material.

* * * * *

UNITED STATES PATENT AND TRADEMARK OFFICE
CERTIFICATE OF CORRECTION

PATENT NO.: 6,090,478
DATED : July 18, 2000
INVENTOR(S): NISHIZAKI et al.

It is certified that an error appears in the above-identified patent and that said Letters Patent is hereby corrected as shown below:

On the title page of the patent insert;

--[30] Foreign Application Priority Data
Mar. 15, 1996 [JP] Japan ........ 8-059243
Sept. 24, 1996 [JP] Japan ........ 8-251904 --

Signed and Sealed this

Seventeenth Day of April, 2001

Attest:

NICHOLAS P. GODICI

Attesting Officer    Acting Director of the United States Patent and Trademark Office